US009945049B2

(12) United States Patent
Veber et al.

(10) Patent No.: US 9,945,049 B2
(45) Date of Patent: *Apr. 17, 2018

(54) METHOD FOR PREPARING SINGLE-CRYSTAL CUBIC SESQUIOXIDES AND USES

(71) Applicant: CENTRE NATIONAL DE LA RECHERCHE SCIENTIFIQUE, Paris (FR)

(72) Inventors: Philippe Veber, Bordeaux (FR); Matias Velazquez, Talence (FR); Oudomsack Viraphong, Talence (FR); Gabriel Buse, Bordeaux (FR)

(73) Assignee: CENTRE NATIONAL DE LA RECHERCHE SCINTIFIQI, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/903,761

(22) PCT Filed: Jul. 23, 2014

(86) PCT No.: PCT/FR2014/051912
§ 371 (c)(1),
(2) Date: Jan. 8, 2016

(87) PCT Pub. No.: WO2015/011416
PCT Pub. Date: Jan. 29, 2015

(65) Prior Publication Data
US 2016/0160383 A1 Jun. 9, 2016

(30) Foreign Application Priority Data

Jul. 24, 2013 (FR) .................................... 13 57308

(51) Int. Cl.
*C03B 19/04* (2006.01)
*C30B 9/12* (2006.01)
(Continued)

(52) U.S. Cl.
CPC ................ *C30B 19/04* (2013.01); *C30B 9/12* (2013.01); *C30B 19/02* (2013.01); *C30B 19/062* (2013.01);
(Continued)

(58) Field of Classification Search
CPC ....... C30B 19/04; C30B 19/062; C30B 29/22; C30B 9/12; C09K 5/14
(Continued)

(56) References Cited

U.S. PATENT DOCUMENTS 9,187,845 B2 * 11/2015 Veber ........................ C30B 9/00
2011/0133111 A1    6/2011 Makikawa et al.
2012/0273713 A1   11/2012 Veber et al.

FOREIGN PATENT DOCUMENTS

WO    2012150037    11/2012

OTHER PUBLICATIONS

Search Report dated 2014.
(Continued)

*Primary Examiner* — Bijan Ahvazi
(74) *Attorney, Agent, or Firm* — IPSILON USA, LLP

(57) ABSTRACT

The present invention relates to a process for the preparation of hulk or thin-film single-crystals of cubic sesquioxides (space group No. 206, Ia-3) of scandium, yttrium or rare earth metals doped or not doped with lanthanide ions having a valency of +III by a high-temperature flux growth technique and to the applications of the nondoped single-crystals obtained according to this process, in particular in the optical field.

16 Claims, 6 Drawing Sheets

(51) Int. Cl.
  *C30B 19/04* (2006.01)
  *C30B 19/02* (2006.01)
  *C30B 29/16* (2006.01)
  *C30B 19/06* (2006.01)
  *C30B 29/22* (2006.01)
  *C09K 5/14* (2006.01)
  *G02F 1/09* (2006.01)

(52) U.S. Cl.
  CPC .............. *C30B 29/16* (2013.01); *C30B 29/22* (2013.01); *G02F 1/09* (2013.01)

(58) Field of Classification Search
  USPC .............. 117/2, 3, 70; 252/71; 423/263, 277
  See application file for complete search history.

(56) References Cited

OTHER PUBLICATIONS

Gourishankar et al: "Thermodynamics of mixed oxide compunds, Li2O A A Ln2O3 (Ln=Nd or Ce)" Dated: Dec. 1, 1997.
Veber et al: "Flux growth of Yb+3 doped Re2O3 (Re=Y, Lu) single crystals at half their melting point temperature" Dated: Jun. 15, 2011.
Peschev et al: "Studies on some ternary oxyborates of the Na2O—Me2O3—B2O2 (Me=rare earth or aluminum) System: Synthesis, structure and crystal growth" Dated: Jan. 27, 2006.

\* cited by examiner

METHOD FOR PREPARING SINGLE-CRYSTAL CUBIC SESQUIOXIDES AND USES

RELATED APPLICATIONS

This application is a National Phase Application of PCT/FR2014/051912, filed on Jul. 23, 2014, which in turn claims the benefit of priority from French Patent Application No. 13 57308 filed on Jul. 24, 2013, the entirety of which are incorporated herein by reference.

BACKGROUND

Field of the Invention

The present invention relates to a process for the preparation of bulk or thin-film single-crystals of cubic sesquioxides (space group No. 206, Ia-3) of scandium, yttrium or rare earth metals doped or not doped with lanthanide ions having a valency of +III by a high-temperature flux growth technique and to the various applications of the single-crystals obtained according to this process, in particular in the optical field.

Description of Related Art

Pure cubic sesquioxides, that is to say nondoped cubic sesquioxides, are crystals which can be used as rotator crystal in Faraday isolators, which are composed of four constituents: an input polarizer, a rotator crystal, a permanent magnet and an output polarizer. This is because the development and the improvement in laser technologies have resulted in a need for optical components which protect the laser cavity from back reflections, Faraday isolators make it is possible to effectively suppress instabilities and fluctuations in intensity in laser systems. They can be used to protect the cavity in gas- or solid-state lasers, and also increasingly powerful laser diodes, from back reflections, as mentioned above, but also to prevent parasitic oscillations in multistage solid-state laser amplifiers. Faraday isolators are optical components which make it possible for light to move in just one direction. Their mode of operation is based on the Faraday effect, which effect proceeds in transmission and is linear in magnetic induction and in wavelength. For the majority of wavelengths, the rotator crystal is a terbium gallium garnet (TGG) placed in a high and homogenous magnetic field. It is in the latter that the polarization of the light ray rotates, according to a "Faraday" angle, proportionally to the Verdet constant, to the distance covered in the rotator crystal and to the electromagnetic induction. In general, these three parameters are adjusted so that the output polarization is rotated by 45°. If a light ray of any polarization comes in the opposite direction, then its polarization is rotated in the same direction: it is the nonreciprocal nature of the Faraday effect which makes it possible in particular to isolate very powerful laser cavities. However, the maximum isolation of the Faraday isolator is limited by the nonuniformities in the TGG crystal and the electromagnetic induction. There thus exists a need for single-crystal cubic sesquioxides which can advantageously be used as rotator crystal in a Faraday isolator, in particular which are capable of enduring high powers in continuous operation.

Solid-state lasers use solid media, such as crystals or glasses, as medium for the emission (spontaneous and stimulated) of photons and amplifier medium. The amplifier medium, or also gain medium, is composed of an optically active material comprising a matrix (glass or crystal) rendered optically active by doping with an ion which absorbs the radiation from an optical pumping source and which is de-excited by emission of photons. The first laser is a ruby laser, the emission of which originates from the $Cr^{3+}$ ion. Other ions are much used: the majority are rare earth metal ions: $Nd^{3+}$, $Yb^{3+}$, $Pr^{3+}$, $Er^{3+}$, $Tm^{3+}$, $Eu^{3+}$, . . . , or also transition metal ions, such as $Ti^{3+}$ or $Cr^{3+}$, inter alia. The emission wavelength of the laser depends essentially on the doping ion for the rare earth metal ions and on the properties of the matrix in all cases, the influence of the latter being much greater in the case of the transition metal ions. Thus, glass doped with neodymium does not emit at the same wavelength (1053 nm) as the crystalline solid known as yttrium-aluminium-garnet (YAG) and composed of $Y_3Al_5O_{12}$ doped with neodymium (1064 nm). Solid-state lasers operate in continuous mode or in pulsed mode (pulses from a few microseconds to a few femtoseconds). They are capable of emitting equally well in the visible region, the near infrared region, the middle infrared region and the ultraviolet region.

Above a crystal dimension of acceptable optical quality, these lasers make it possible to obtain powers of the order of approximately ten watts continuously and higher powers in pulsed mode. They are used for both scientific and industrial applications, such as welding, marking and cutting of materials.

In addition to their use in the manufacture of high-power lasers and/or short-pulse lasers, these solid materials, formed of a matrix and of a doping ion, can also be used in the manufacture of eye-safety lasers, of lasers for surgery and/or ophthalmology (diode-pumped lasers, pulsed or continuous, in the red region, the green region and up to the middle infrared region), of scintillators, of waveguides, of bolometers (detectors having heat/light discrimination), for optical cooling, as luminophoric materials or alternatively as materials for the storage and handling of quantum information.

At the current time, the most promising crystalline solids for all of these applications, and in particular for the manufacture of lasers, are cubic (thus isotropic) sesquioxides of formula $R_2O_3$ in which R represents one or more elements chosen from metals having a valency of III, such as scandium, yttrium and the rare earth metals (La, Ce, Pr, Nd, Pm, Sm, Eu, Gd, Tb, Dy, Ho, Er, Tm, Yb, Lu), doped with rare earth metal ions. Some of them exhibit in particular a greater thermal conductivity than that of YAG doped with rare earth metal ion, which is nevertheless the most widely used laser material at the current time. These cubic sesquioxides are also advantageous insofar as they can be easily doped with rare earth metal ions and have a high density (of the order of 4 to 9.5 $g \cdot cm^{-3}$ approximately). Furthermore, yttrium, scandium, gadolinium and lutetium sesquioxides exhibit low phonon energies in comparison with the majority of oxides, in particular YAG.

These materials are mainly obtained in the form of transparent ceramics prepared by high pressure and high temperature sintering, preferably under vacuum. However, these ceramics exhibit a polycrystalline microstructure with numerous grain boundaries, diminishing the physical properties at the basis of their applications (diffusion of photons, presence of impurities, low thermal conductivity, limited degree of doping, and the like).

A process for the synthesis of single-crystal cubic sesquioxides targeted at overcoming the disadvantages of the processes previously known from the prior art has already been provided in the international application WO 2011/055075, The process provided was targeted in particular at obtaining, in a simple and inexpensive way, single-crystal cubic sesquioxides of scandium, yttrium or rare earth metal doped with rare earth metal ions exhibiting, with an equivalent chemical composition, a greater size than that of the single-crystals obtained according to the processes of the prior art, while having very good optical properties. The sesquioxides prepared according to the process described in the international application WO 2011/055075 correspond to the following formula $R^1_2O_3:R^2$, in which $R^1$ is at least one metal having a valency of III chosen from scandium, yttrium and the elements of the series of the lanthanides, that is to say from the elements having an atomic number ranging from 57 (lanthanum) to 71 (lutetium) according to the Periodic Table of the Elements, and $R^2$ is at least one element chosen from the series of the lanthanides. This process consists in preparing a pulverulent mixture comprising at least one solute, composed of a mechanical mixture of at least one sesquioxide of formula $(R'^1_2O_3)_{1-x}$ in a molar percentage $(1-x)$ and of at least one sesquioxide $(R'^2_2O_3)_x$ in a molar percentage (x) in which $R'^2$ is identical to $R^1$ and $R'^2$ is identical to $R^2$, and a synthesis solvent of following formula: $[Li_6(R'''^1_{1-x'}, R''^2_{x'})(BO_3)_3]$, in which $R'''^1$ and $R''^2$ are respectively identical to $R^1$ and $R^2$ and x'=x, in then bringing said pulverulent mixture to a temperature at least equal to the melting point of said mixture and $\leq 1250°$ C., in order to bring about the dissolution of the solute in the solvent of formula $[Li_6(R'''^1_{1-x'}, R''^2_{x'})(BO_3)_3]$ and to obtain a liquid solution of said solute in said solvent, and in then carrying out the growth of the crystal on a solid support under controlled temperature conditions.

Although this process made it possible to overcome certain disadvantages brought about by the processes of the prior art, in particular in that it makes it possible to achieve crystals of centimetric size in their greatest length, it nevertheless still exhibits certain disadvantages, In particular, the crystallogenesis process is very slow (at least 40 days on average) and the crystals obtained nevertheless do not always have a sufficient size due to a very high polynucleation during the crystallization process, resulting in a reduction in the mean size of each single-crystal. Furthermore, the crystals obtained exhibit numerous solvent inclusions. These inclusions limit the working volume of the crystals, that is to say the volume where there are no inclusions, which can reduce the working volume to a size of $4 \times 2$ mm$^2$ for a single-crystal initially having a centimetric size after synthesis.

OBJECTS AND SUMMARY

The applicant company thus set itself the aim of further improving the process described in the international application WO 2011/055075 in order to provide a process which makes it possible to reproducibly and more quickly access crystals simultaneously exhibiting a greater size while comprising fewer solvent inclusions.

A subject matter of the present invention is a process for the preparation of a bulk or thin-film single-crystal formed of a matrix of a cubic sesquioxide of scandium, yttrium and/or rare earth metal, said matrix being doped or not doped with at least one element of the series of the lanthanides, said single-crystal corresponding to the following formula (I):

in which:
$R^1$ is at least one metal with a valency of III chosen from scandium, yttrium and the elements of the series of the lanthanides, that is to say from the elements having an atomic number ranging from 57 (lanthanum) to 71 (lutetium) according to the Periodic Table of the Elements;

x is such that $0 \leq x < 1$;

$R^2$ represents at least one element chosen from the series of the lanthanides;

said process being characterized in that it is carried out in a chemically inert crucible and in that it comprises the following stages consisting in:

1) preparing a pulverulent mixture (PM1) comprising at least:
   a solute composed of at least one sesquioxide of following formula (IIa): $R^1_2O_3$ (IIa), in which $R^1$ represents the same element as $R^1$, and, when said matrix is doped with at least one element of the series of the lanthanides, of at least one sesquioxide of following formula (IIb): $R'^2_2O_3$ (IIb), in which $R'^2$ represents the same element as $R^2$, in a molar percentage $(x_{mp})$ such that $0 < x_{mp} \leq 25$ mol %, it being understood that said sesquioxide of formula (IIa) is then present within said solute in a molar percentage $100-x_{mp}$, said solute being present within the mixture PM1 in an amount z such that $0 < z \leq 93$ mol %,
   a primary solvent composed of a mechanical mixture of a compound of following formula (III):

in which $R'''^1$ and $R''^2$ respectively represent the same element as $R^1$ and $R^2$ and x' is such that $0 \leq x' < 1$;

2) preparing a pulverulent mixture PM2 comprising said solute and a synthesis solvent of following formula (IV):

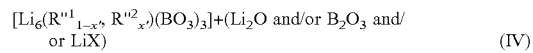

in which $R'''^1$ and $R''^2$ respectively represent the same element as $R^1$ and $R^2$, x' is such that $0 \leq x' < 1$, and X=F, Cl, Br or I, by addition to the mixture PM1 of at least one pulverulent additive chosen from $Li_2O$, $B_2O_3$ and LiX with X=F, Cl, Br or I, said mixture PM1 being present within the mixture PM2 in an amount z' such that $15 \leq z' < 100$ mol %, said additive being present within the mixture MP2 in a total molar amount s such that $0 < s \leq 85$ mol %, and s=100-z' in the mixture PM2; the molar amount z" of the solute within the mixture PM2 being such that z"=z·z';

3) bringing the pulverulent mixture PM2 obtained above in stage 2) to a temperature $T_{PM2}$ at least equal to the melting point $(T_{M.p.})$ of said mixture PM2 and $\leq 1250°$ C., in order to bring about the dissolution of the solute in the synthesis solvent of formula (IV) and to obtain a liquid solution of said solute in the synthesis solvent of formula (IV);

4) maintaining the temperature of the liquid solution at the temperature $T_{PM2}$ for a period of time of at least 6 hours, with stirring by means of a solid support subjected to rotation around a vertical axis;

5) cooling, in controlled fashion, the liquid solution from the temperature $T_{PM2}$ down to a temperature $T_{Exp}$ between the saturation temperature $(T_{Sat})$ of the liquid solution and the critical supersaturation temperature $(CT_{Super})$ of the liquid solution or the temperature of solidification of the liquid solution, in order to bring about the controlled crystallization of the expected sesquioxide of formula (I) on said solid support immersed in said liquid solution and subjected to rotation around a vertical axis, said cooling being carried out at a maximum rate of $1°$ C.·h$^{-1}$;

6) withdrawing the solid support from the liquid solution and then cooling, in controlled fashion, the sesquioxide of formula (I) crystallized on the solid support from the temperature $T_{Exp}$ down to ambient temperature, at a maximum rate of 50° C. $h^{-1}$.

In comparison with the process described in international application WO 2011/055075, the process in accordance with the present invention, which employs a synthesis solvent incorporating a compound chosen from $Li_2O$, $B_2O_3$ and LiX with X=F, Cl, Br or I, makes it possible:

to access, more rapidly and reproducibly, doped or non-doped single-crystals of greater size and exhibiting inclusion-free regions which are considerably bigger than those obtained when the solvent used for the synthesis does not comprise such an additive;

to access crystals in which the matrix comprises lithium, that is to say in a minimum amount (of the order of a few ppm to a few hundred ppm), and the presence of which has a very surprising effect on the optical properties of the doped sesquioxide crystals, that is to say crystals of formula (I) in which x>0, insofar as this results in a nonuniform broadening of the emission bands of the dopant, which is advantageous when these crystals are used for ultrashort pulsed laser applications.

This is because the presence of Li and B in a moderate content, of the order of $10^{17}$ to $10^{18}$ atoms/$cm^3$, introduces a crystal chemistry disorder which, by a medium range elastic deformation, results in a crystal field distribution over the sites of the optically active ion, such as $Yb^{3+}$, for example. These random variations can cause the energy of the emitter level to fluctuate from one site to the other over an order of size of several tens of $cm^{-1}$. Consequently, the emission band on which the optical amplification in the crystal is based is broadened. As a result of the time-energy indetermination relationship, this emission bandwidth opens the way to the production of ultrashort pulses and also to high tunability of the laser.

According to a specific embodiment of the process in accordance with the invention, stages 1) and 2), resulting in the mixture PM2, are carried out jointly. In this case, the molar amount (z") of the solute within the mixture PM2 is then such that z"=zz' mol %, the molar amount of the primary solvent of formula (III) (t) is such that t=z'(100−z) mol % and the molar amount of additive is s mol %, with s=(100−z') %.

Within the meaning of the present invention, the terms "represents the same element as" used to describe the radicals $R'^1$, $R''^1$, $R'^2$ and $R''^2$, with reference to $R^1$ and $R^2$, mean, for example, that, when $R^1$ is yttrium (Y), $R'^1=R''^1=Y$, and, when $R^2$ is ytterbium (Yb), $R'^2=R''^2=Yb$.

Saturation temperature is understood to mean the temperature at which the solubility limit of the solute in the solution is reached (solubility equilibrium). At this temperature, and above a certain amount of solute already introduced and dissolved in solution, the additional solute can precipitate in the solid form. The saturation temperature depends on the molar amount "z"" of the solute in the solution. The solubility equilibrium as a function of the molar amount of the solute in the solution is then described by the liquidus curve in a Solvent/Solute phase diagram, as appears in the appended FIG. 1.

The critical supersaturation temperature is the temperature at which the precipitation of the solute occurs spontaneously. Below this limit, which is also a function of the molar amount "z"" of the solute in the solution, the crystallization of the solute cannot be controlled and takes place spontaneously.

The supersaturation temperature ($T_{Super}$) is a temperature lower than the saturation temperature and greater than the critical supersaturation temperature. It corresponds to a range of temperatures in which the solute occurs in a metastable state which allows it to crystallize in a controlled way without precipitation occurring. The thermodynamically metastable region is between the saturation temperature and the critical supersaturation temperature; it is a function of the molar amount "z"" of the solute in the solution and is called the "Ostwald-Miers region" (see appended FIG. 1).

According to the invention, $T_{Exp}$ thus corresponds to the "experimental" temperature at which the controlled crystallization of the sesquioxide of formula (I) is carried out; as indicated above, this temperature is between the saturation temperature ($T_{Sat}$) of the liquid solution and the critical supersaturation temperature ($CT_{Super}$) of the liquid solution or the temperature of solidification of the solution; for a given solute, this temperature is in the Ostwald-Miers region.

These definitions are found in the work D. Elwell and H. J. Scheel, Crystal Growth from High-Temperature Solutions, Academic Press, 1975, chapter 4 (pp. 138-201) and chapter 7 (pp. 278-432).

Still according to the invention, "thin film" is understood to mean a film having a thickness which varies from 1 to 500 μm and preferably from 1 to 100 μm.

In the above formula (I), it is indicated that $R^1$ represents at least one metal having a valency of III. This means that $R^1$ can either be a single element chosen from scandium, yttrium and the elements of the series of the lanthanides or a combination of at least 2 of these elements, such as, for example, a Y/Gd, Gd/La, Y/Lu, Gd/Lu, La/Lu, Y/La, Y/Sc, Gd/Sc, La/Sc or Lu/Sc combination. In this case, the crystal of formula (I) is what it is appropriate to call a solid solution doped with at least one rare earth metal ion.

In the same way, in the above formula (I), it is indicated that x is such that 0≤x<1. This means that, when x=0, $R^2$ is absent and that, when x>0, $R^2$ is present and is either a single element chosen from the series of the lanthanides or a combination of at least 2 of these elements, such as, for example, a Yb/Pr, Yb/Tm, Yb/Tb, Yb/Ho, Er/Yb, Tm/Tb, or Tm/Ho combination; the term used is then codoping or codoped crystal.

According to a preferred embodiment of the invention, $R^1$ is chosen from the elements Y, Gd, Tb, Eu, Sc and Lu and the combinations of elements Y/Gd, Y/Sc, Gd/Sc, Lu/Sc, Gd/La, Gd/Tb, Gd/Lu, Y/Lu, Eu/Gd, En/La and Eu/Lu.

Again according to a preferred embodiment of the invention, and when x>0, $R^2$ is chosen from the elements Yb, Tm, Er, Pr, Tb, Nd, Ce, Ho, Eu, Sm and Dy and the combinations of elements Yb/Tm, Yb/Pr, Tm/Ho, Er/Yb, Yb/Tb, Yb/Ho, Eu/Sm and Tm/Tb.

According to a preferred embodiment of the invention, said process is employed for the preparation of sesquioxides of formula (I) chosen from:

$Tb_2O_3$; $Gd_2O_3$; $Eu_2O_3$; $Y_2O_3$; $Lu_2O_3$; $Sc_2O_3$; $(Tb,Gd)_2O_3$; $(Eu,Gd)_2O_3$; $Lu_2O_3$:Yb; $Gd_2O_3$:Yb; $Lu_2O_3$:Eu; $Gd_2O_3$:Eu; $Y_2O_3$:Eu; $Y_2O_3$:Er; $Gd_2O_3$:Tm; $Gd_2O_3$:$Eu^{3+}$; $(Y,Gd)_2O_3$:Pr; $(Y,Gd)_2O_3$:Eu; $(Y,Gd)_2O_3$:Nd; $(Y,La)_2O_3$:Pr; $(Gd,La)_2O_3$:Pr; $(Gd,La)_2O_3$:Yb; $(Gd,La)_2O_3$:Eu; $(Gd,La)_2O_3$:Nd; $(Y,La)_2O_3$:Yb; $Y_2O_3$:Er:Yb; $Y_2O_3$:Pr:Yb; $Gd_2O_3$:Er:Yb; $Gd_2O_3$:Pr:Yb; $Gd_2O_3$:Tm:Yb; $Lu_2O_3$:Tm:Yb; $Y_2O_3$:Tm:Ho; $Y_2O_3$:Tm:Yb; $Y_2O_3$:Tm:Tb; $Sc_2O_3$:Eu; $(Y,Lu)_2O_3$:Eu and $(Gd,Lu)_2O_3$:Eu.

Within the meaning of the present invention, "solute" refers to a sesquioxide of formula (IIa) or the mixture of a sesquioxide of formula (IIa) and of a sesquioxide of formula (IIb), said formulae being as defined above.

As was defined above, the solute is present in a molar amount z″ such that 0<z″<93 mol % of the mixture PM2. This amount corresponds to the maximum amount of solute crystallisable in the single-crystal form from the synthesis solvent of formula (IV) in a range of temperatures of less than 1250° C.

According to a preferred embodiment of the invention, the amount z″ of solute present within the pulverulent mixture PM2 is >0 mol % and >30 mol % and more preferably still this amount is such that 5≤z″≤30 mol %.

According to a preferred embodiment of the invention, the amount s of $Li_2O$ and/or of $B_2O_3$ and/or of LiX present within the pulverulent mixture PM2 is >0 mol % and ≤30 mol % and more preferably still this amount is such that 5≤s≤30 mol %.

According to a form, also preferred, of the invention, $x_{mp}=0$ or $0<x_{mp}≤10$ mol %. Again according to a preferred embodiment of the invention, x has the same value as x′ (x=x′), that is to say that the solute and the primary solvent contain the same amount of dopant ($R'^2/R''^2$).

According to a specific and preferred embodiment of the invention, the pulverulent mixture PM2 produced during stages 1) and 2) and comprising the solute composed of a sesquioxide of formula (IIa) as a mixture or not with a sesquioxide of formula (IIb) and the synthesis solvent of formula (IV) is prepared according to the process comprising the substages consisting in:

i) preparing, by mechanical grinding, a pulverulent mixture comprising 6 mol of $Li_2CO_3$, 6 mol of $H_3BO_3$, 1+z mol of a sesquioxide of formula (IIa) or of a mixture of a sesquioxide of formula (IIa) and of a sesquioxide of formula (IIb), to which an excess of 20 mol % of at least one additive chosen from $Li_2O$ (in the $Li_2CO_3$ form), $B_2O_3$ (in the $H_3BO_3$ form) and LiX, with X=F, Cl, Br or I, is added;

ii) subjecting the mixture obtained above in stage i) to a heat treatment comprising:
  a rise in temperature up to a temperature T1 of from 400 to 500° C. approximately, according to a temperature rise gradient of from 120 to 180° C. $h^{-1}$ approximately,
  a stationary phase during which the temperature T1 is maintained for from 6 to 24 hours approximately,
  a rise in temperature up to a temperature T2 of from 700 to 800° C. approximately, according to a temperature rise gradient of from 120 to 180° C.·$h^{-1}$ approximately,
  a stationary phase during which the temperature T2 is maintained for from 6 to 24 hours approximately,
  a return to ambient temperature with a cooling gradient of from 120 to 180° C.·$h^{-1}$ approximately, in order to obtain a solid material in the form of particles, said material being composed of the synthesis solvent of formula (IV) as a mixture with z″ mol % of solute;

iii) mechanically grinding the solid material obtained above in stage ii) in order to obtain the pulverulent mixture PM2.

The grinding of stage iii) above makes it possible to reduce the particle size of the solid material obtained in the form of coarse particles in stage ii) above and to obtain the mixture PM2 in the form of an intimate mixture of the synthesis solvent of formula (IV) and of the solute.

During stage 3), the temperature $T_{PM2}$ is preferably from 1200° C. to 1250° C. and the rate at which the mixture PM2 is brought to the temperature $T_{PM2}$ is preferably of the order of 120° C.·$h^{-1}$.

During stage 5), the temperature $CT_{Super}$ is preferably of the order of 1100° C. approximately and the controlled cooling of the liquid solution from the temperature $T_{PM2}$ down to a temperature $T_{Exp}$ is preferably carried out at a rate of from 0.1 to 1° C.·$h^{-1}$.

According to a specific embodiment of the process, stage 5) of controlled cooling can be carried out by pulling the crystal, that is to say by slowly raising the solid support, still under rotation, according to a vertical movement. This pulling makes it possible to favour a given direction of growth according to a well-determined family of planes with the aim of resulting in a single-crystal corresponding to the physical properties desired for the latter as a function of the application envisaged. In this case, the pulling can be carried out at a pull rate ($R_P$) such that $0.01≤R_P≤0.1$ mm·$h^{-1}$.

According to a preferred embodiment of the invention, stage 4) is carried out without pulling the crystal ($R_P=0$ mm·$h^{-1}$).

The sesquioxides of formulae (IIa) and (IIb) used in stage 1) of the process in accordance with the invention are commercial products or are obtained by reduction of commercial products by heat treatment.

The various stages of the process in accordance with the invention, and also the substages i) to iii) of stages 1) and 2), if appropriate, are carried out in a crucible which is chemically inert with respect to the entities which it contains. Such a crucible can, for example, be chosen from platinum, iridium or glassy carbon crucibles.

When a platinum crucible (only in this case) is used, the various stages of e process can be carried out in air (ambient atmosphere) except when $R^1$ denotes cerium (Ce) and/or terbium (Tb) and/or praseodymium (Pr); the stages of the process are then preferably carried out under a neutral or reducing atmosphere, for example under argon comprising 5% by volume of hydrogen. When an iridium or glassy carbon crucible is used, the stages of the process are preferably carried out under a neutral atmosphere, for example under argon, but can nevertheless be carried out under a reducing atmosphere, although this is not preferred, except with cerium, praseodymium and terbium.

The solid crystallization support is preferably composed of a platinum paddle, of a platinum wire or of an assembly formed by a platinum disc attached horizontally at its centre to a vertical platinum wire itself suspended from an alumina rod or alternatively of an oriented single-crystal or polycrystalline seed attached to a platinum wire itself suspended from an alumina rod.

According to a preferred embodiment, the solid crystallization support is a platinum paddle in the form of a shovel, of a platinum wire (diameter of the order of a millimetre), of an inverted "T" made of platinum (in this case, the horizontal bar of the "T" is parallel to the bottom of the crucible), of an "L" made of platinum or of a horizontal disc attached at its centre by a platinum wire having a diameter of the order of a millimetre.

When the single-crystal of formula (I) is grown by using, as solid support, an oriented single-crystal or polycrystalline seed, the latter is then of the same chemical and/or structural nature as the solute which it is desired to crystallize (for example, a rare earth metal sesquioxide). The seed is then immersed in the liquid solution in order for growth by liquid phase epitaxy (LPE) of the solute to be able to be carried out on said seed, which is also the case when the platinum objects mentioned above are used. When growth is carried out by LPE, the single-crystal of formula (I) is obtained in the form of a thin film.

The various stages of the process requiring a heat treatment without stirring (stage 3) and substages ii) of stages 1)

and 2)) are preferably carried out in a vertical tubular furnace or in a muffle furnace.

The various stages of the process requiring a heat treatment with stirring (stages 4) and 5)) are preferably carried out in a vertical tubular furnace equipped with a paddle for homogenizing the liquid solution and which can act as crystallization support, said paddle being integral with a mechanical rotation/translation/weighing system via the solid crystallization support (seed or platinum wire or platinum paddle, and the like) attached to an alumina rod itself connected to the rotation/pulling/weighing system.

Stage 6) of the process is preferably carried out in a vertical tubular furnace without stirring.

During stages 4), and 5), the rotational speed of the solid support preferably varies from 5 to 50 revolutions/min and more particularly still from 10 to 35 revolutions/min during stage 5).

According to a preferred embodiment of the process of the invention, the cooling of stage 5) is carried out at a rate of $0.2°$ $C.·h^{-1}$ from the temperature $T_{PM2}$ down to a temperature $CT_{Super}$ of $1100°$ C., after extracting the support from the liquid and positioning the support above the liquid solution, and then the temperature of $1100°$ C. is maintained for a time of less than 1 hour (thermalization) before carrying out the cooling mentioned in stage 6). In this case, the cooling of stage 6) is preferably carried out at a rate of less than $50°$ $C.·h^{-1}$ approximately and can be carried out in several stages.

According to another preferred embodiment of the process of the invention, the cooling of stage 5) is a "sawtooth" cooling, that is to say a heat treatment comprising an alternation of cooling stages and of temperature-rise stages in which the amplitude of each temperature-rise stage is less than or equal to the amplitude of the cooling stage which precedes it. According to a specific embodiment of implementation, the rate of cooling preferably varies from 0.1 to 0.2 $C·h^{-1}$ and the cooling of stage 5) is carried out according to the following heat treatment:

Starting temperature: $1200°$ C.
i) gradient of $0.2°$ $C.·h^{-1}$ down to $1175°$ C.,
ii) gradient of $180°$ $C.·h^{-1}$ up to $1190°$ C.,
iii) gradient of $0.2°$ $C.·h^{-1}$ down to $1150°$ C.,
iv) gradient of $180°$ $C.·h^{-1}$ up to $1165°$ C.,
v) gradient of $0.2°$ $C.·h^{-1}$ down to $1125°$ C.,
vi) gradient of $180°$ $C.·h^{-1}$ up to $1140°$ C.,
vii) gradient of $0.2°$ $C.·h^{-1}$ down to $1100°$ C.,
viii) gradient of $180°$ $C.·h^{-1}$ up to $1115°$ C.,
ix) gradient of $0.2°$ $C.·h^{-1}$ down to $1100°$ C., According to this embodiment, the cooling of stage 6) is then preferably carried out at a rate of $5°$ $C.·h^{-1}$ down to $800°$ C. and then of $30°$ $C.·h^{-1}$ approximately down to ambient temperature and more preferably still of $0.5°$ $C.·h^{-1}$ down to $1000°$ C., then of $5°$ $C.·h^{-1}$ down to $800°$ C. and of $30°$ $C.·h^{-1}$ down to ambient temperature.

Carrying out stage 5) according to such a "sawtooth" heat treatment exhibits the advantage of limiting multiple heterogeneous nucleation on the solid support (seed, platinum paddle, platinum disc or platinum wire, or the like) and thus facilitates the obtaining of just one single-crystal of good quality.

Due to their very good crystalline qualities and their large size, the single-crystal sesquioxides of formula (I) obtained according to the process in accordance with the invention can advantageously be used in the optical field or as substrate for solid, liquid or gas phase epitaxy.

The single-crystal sesquioxides of formula (I) as defined above and obtained according to the process in accordance with the present invention can be used for optical applications, in the manufacture of materials for optical cooling, as optical isolator and as oriented substrate (in particular along the 2 −1 −1 direction) for epitaxy.

In particular, the sesquioxides of formula (I) in which x=0 (nondoped compounds) can be used as optical isolator and as rotator crystal for optical circulation by Faraday rotation, which constitutes another subject matter of the invention.

The present invention is illustrated by the following implementational examples, to which, however, it is not limited.

DETAILED DESCRIPTION

EXAMPLES

Figure 1:
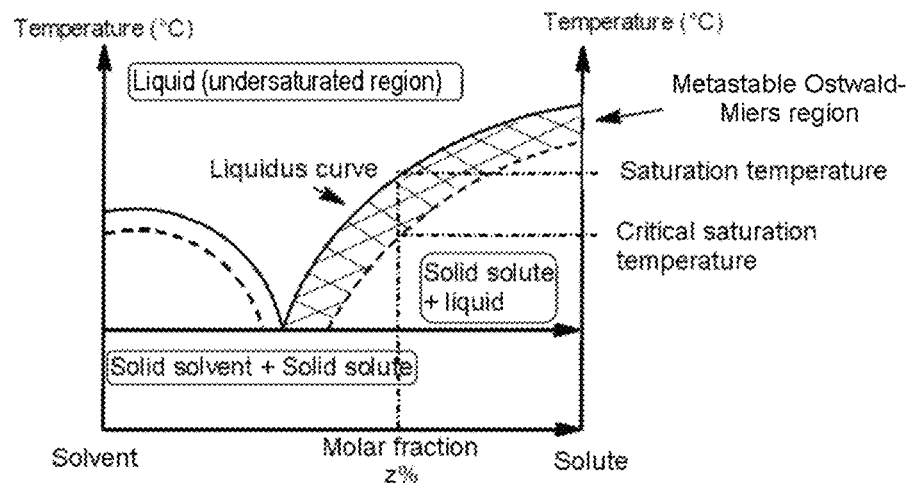
FIG. 1 is a solvent/solute phase diagram in accordance with one embodiment.

The starting materials used in these examples are powders with a purity of 99.99%.

$Gd_2O_3$, $Yb_2O_3$, $Li_2CO_3$ and $H_3BO_3$ powders sold by Fox Chemicals, $Tb_4O_7$ powder sold by Oxymet Ltd.

Except for the commercial $Tb_4O_7$ powder, the other powders were used as received from the manufacturer.

The reactions for the synthesis of the powders of solute and of synthesis solvent of formula (IV) can be carried out simultaneously in the same platinum crucible after prior intimate mixing and grinding of these with one another.

EXAMPLE 1

Crystallogenesis of $Gd_2O_3$ Single-Crystals Doped with Ytterbium According to the Process in Accordance with the Invention In this example, single-crystal cubic gadolinium sesquioxides doped to $x_{mp}$=6.67 mol % (x=x'=0.0667) with ytterbium: $Gd_2O_3$:$Yb^{3+}$, were prepared by using [$Li_6$($Gd_{0.9333}Yb_{0.0667}$)($BO_3$)$_3$] primary solvent to which z=20 mol % of solute $Gd_2O_3$:$Yb^{3+}$ were added.

An excess of s=19.35 mol % of $Li_2O$ was subsequently added to this base mixture.

1) First Stage: Preparation of a Mixture PM2 Composed of [$Li_6$($Gd_{0.9333}Yb_{0.0667}$)($BO_3$)$_3$], $Li_2O$ and ($Gd_{0.9333}Yb_{0.0667}$)$_2O_3$ 1.1) Preparation of Solute Composed of a Mechanical Mixture of Gadolinium Sesquioxide and Ytterbium Sesquioxide The solute was prepared by mechanically mixing 93.33 mol % of $Gd_2O_3$ and 6.67 mol % of $Yb_2O_3$.

The commercial $Gd_2O_3$ and $Yb_2O_3$ powders were mixed according to the stochiometric proportions indicated above and then intimately ground in a mortar in order to obtain the finest particle size possible and the most homogenous mechanical mixture possible. 32.4 g of a solute of $Gd_2O_3$ doped with ytterbium of formulation ($Gd_{0.9333}Yb_{0.0667}$)$_2O_3$ were thus obtained.

1.2) Preparation of a Mixture PM1 Composed of ($Gd_{0.9333}Yb_{0.0667}$)$_2O_3$ as Solute and of [$Li_6$($Gd_{0.9333}Yb_{0.0667}$)($BO_3$)$_3$] as Primary Solvent The mixture PM1 was synthesized according to the following reaction 1:

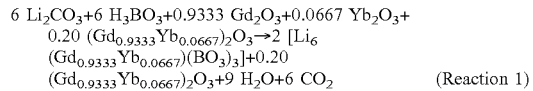

6 $Li_2CO_3$+6 $H_3BO_3$+0.9333 $Gd_2O_3$+0.0667 $Yb_2O_3$+ 0.20 ($Gd_{0.9333}Yb_{0.0667}$)$_2O_3$→2 [$Li_6$ ($Gd_{0.9333}Yb_{0.0667}$)($BO_3$)$_3$]+0.20 ($Gd_{0.9333}Yb_{0.0667}$)$_2O_3$+9 $H_2O$+6 $CO_2$     (Reaction 1)

The commercial $Li_2CO$, $H_3BO_3$, $Gd_2O_3$ and $Yb_2O_3$ powders were mixed beforehand according to the stochiometric proportions shown by reaction 1 above and then intimately ground in a mortar in order to obtain the finest particle size possible and the most homogeneous mechanical mixture possible.

133.3055 g of primary solvent and 32.4 g of solute ($Gd_{0.9333}Yb_{0.0667}$)$_2O_3$ were prepared, i.e. z=20 mol % of solute with in the primary solvent, 165.7055 g of mixture PM1 were thus obtained.

1.3) Preparation of a Mixture PM2

A further 7.8542 g of $Li_2CO_3$ (i.e., the equivalent of 3.1763 g of $Li_2O$) were added to the mixture PM1 obtained above in stage 1.2). This corresponds to an addition of s=19.35 mol % of excess of $Li_2O$ with respect to the mixture PM1.

The commercial $Li_2CO_3$ powder and the powder of the mixture of PM1were mixed and then intimately ground in a mortar in order to obtain the finest particle size possible and the most homogeneous mechanical mixture possible.

The resulting mixture was subsequently heated in a platinum crucible under an air atmosphere according to the following heat treatment:

1) gradient of 120° C.·h$^{-1}$ up to 500° C. and then a stationary phase lasting 12 h;

2) gradient of 120° C.·h$^{-1}$ up to 800° C. and then a stationary phase lasting 12 h;

3) gradient of 180° C.·h$^{-1}$ up to 1250° C. and then a stationary phase lasting 2 h, this being done in order to bring about the dissolution of the solute in the synthesis solvent;

4) cooling down to ambient temperature with a cooling rate of 180° C.·h$^{-1}$.

The mixture PM2 thus obtained, composed of the synthesis solvent [$Li_6$($Gd_{0.9333}Yb_{0.0667}$)($BO_3$)$_3$]+$Li_2O$ to which the solute had been added, was subsequently ground using a mortar and a pestle made of agate. A mixture PM2 composed of 136.4818 g of synthesis solvent and 32.4 g of solute, i.e. z'=16.14 mol % of solute within the synthesis solvent, was thus obtained.

2) Second Stage: Crystallogenesis of $Gd_2O_3$:$Yb^{3+}$ Single-Crystals

The mixture PM2 obtained above in stage 2) was subsequently melted under air, in a vertical tubular furnace, by first of all applying a temperature rise gradient of 180° C.·h$^{-1}$ up to 1250° C.

Figure 2:
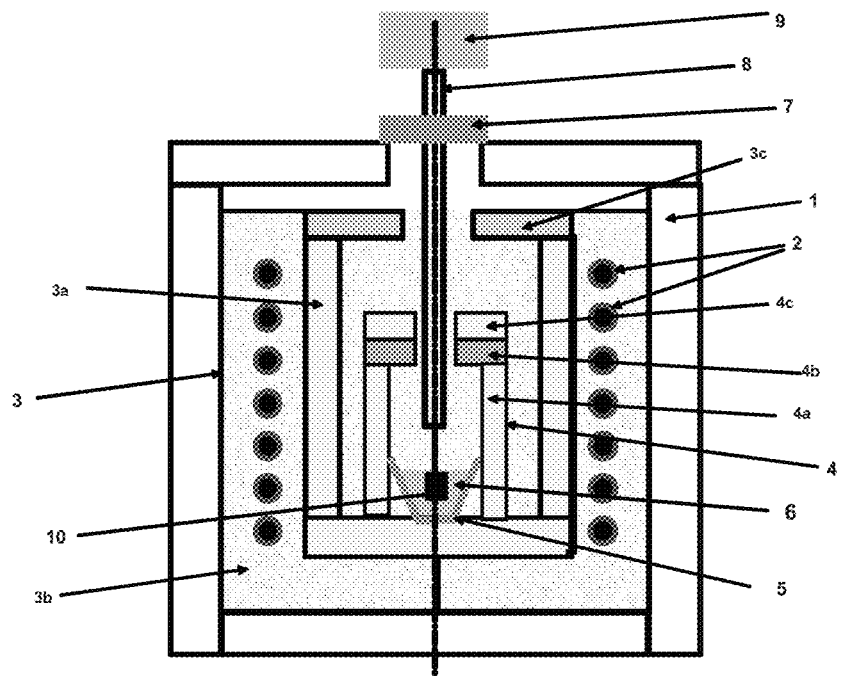
FIG. 2 is a diagram of a vertical tubular furnace from example 1, in accordance with one embodiment.

The vertical tubular furnace used in this example is represented in the appended FIG. 2. It comprises a water-cooled stainless steel chamber (1) in which are positioned heating elements (2) and an internal chamber (3) made of refractory material composed of an alumina tube (3a), of Fibrothal® and silica wool (3b) and of an alumina washer (3c). The internal chamber (3) includes a heat reflector (4) positioned around a crucible (5) containing the molten reaction mixture (solution) (6), said heat reflector (4) being composed of a backing alumina tube (4a) for the reflector (4) surmounted by a platinum washer (4b) itself surmounted by an alumina washer (4c). On its upper part, the chamber (1) is provided with a leaktight passage (7) guaranteeing the growth atmosphere in the chamber of the furnace, through which passes an alumina rod (8) integral with a mechanical rotation/translation system and with a weighing device (balance having an accuracy of 10$^{-3}$ g) (9) and comprising, at its end, a solid support for homogenizing and countering sedimentation of the solute (10) by stirring the solute in the solvent for the growth of the single-crystal, said support (10) being immersed in the reaction mixture (6) present in the crucible (5).

The support (10) can be composed of a platinum paddle, of a platinum wire or of an assembly formed by a platinum disc attached horizontally at its centre to a vertical platinum wire itself suspended from an alumina rod or alternatively of an oriented crystal or polycrystalline seed attached to a platinum wire itself suspended from an alumina rod.

In this example, the solid support (10) which was used was a platinum disc attached horizontally at its centre to a vertical platinum wire itself suspended from an alumina rod.

The temperature gradients in the furnace (radial and longitudinal gradients) are of the order of 1° C.·cm$^{-1}$, so that the minimum temperature of the reaction mixture is located at the centre and at the surface of the reaction mixture.

The heat reflector (4), provided with an alumina washer (thickness >1 mm) (4b) as well as a graphite washer (thickness >2 mm) (4c), makes it possible to reduce the temperature gradients. The temperature in the reaction mixture is thus rendered homogeneous.

After thermalization, the solid support was immersed by translation along the axis of the furnace (1) and of the crucible (5) into the reaction mixture down to a height of 1 mm from the bottom of the crucible, so that only the platinum constituting the disc and the wire of the support (10) is in contact with the molten reaction mixture and so that the end of the alumina rod (8) (point of attachment between the platinum wire and the rod) is at least at more than 1 cm from the surface of the reaction mixture at a minimum.

The platinum disc was immersed by translation in the reaction mixture at the centre of the crucible. Stirring by rotation around the axis of the rod, of the order of 30 revolutions/min, was carried out for 24 hours at 1250° C. with the aim of thoroughly homogenizing the dissolved entities (solute) in the synthesis solvent and of preventing them from sedimenting, if appropriate.

In view of the high viscosity of the molten bath, sufficient stirring, of the order of 20 rev/min or more, proved to be necessary in order to keep the entities dissolved throughout the liquid phase and to alleviate the effects of sedimentation of the solute.

Crystal growth was carried out according to the following heat treatment programme:

Starting temperature: 20° C.
gradient of 120° C.·h$^{-1}$ down to 1250° C. and then a stationary phase lasting 24 h,
gradient of 180° C.·h$^{-1}$ down to 1200° C. and then a stationary phase lasting 4 h,
gradient of 0.2° C.·h$^{-1}$ down to 1175° C. and then a stationary phase lasting 0.1 h,
gradient of 180° C.·h$^{-1}$ up to 1190° C. and then a stationary phase lasting 0.1 h,
gradient of 0.2° C.·h$^{-1}$ down to 1150° C. and then a stationary phase lasting 0.1 h,
gradient of 180° C.·h$^{-1}$ up to 1165° C. and then a stationary phase lasting 0.1 h,
gradient of 0.2° C.·h$^{-1}$ down to 1125° C. and then a stationary phase lasting 0.1 h,
gradient of 180° C.·h$^{-1}$ up to 1140° C. and then a stationary phase lasting 0.1 h,
gradient of 0.2° C.·h$^{-1}$ down to 1100° C. and then a stationary phase lasting 0.1 h,
gradient of 180° C.·h$^{-1}$ up to 1115° C. and then a stationary phase lasting 0.1 h,
gradient of 0.2° C.·h$^{-1}$ down to 1100° C. and then a stationary phase lasting 0.1 h,
no pulling from the solution,
extraction of the platinum disc above the molten bath at 1100° C.,
gradient of 0.5° C.·h$^{-1}$ down to 1000° C.,
gradient of 2° C.·h$^{-1}$ down to 800° C.,
gradient of 60° C.·h$^{-1}$ down to ambient temperature.

Figure 3:
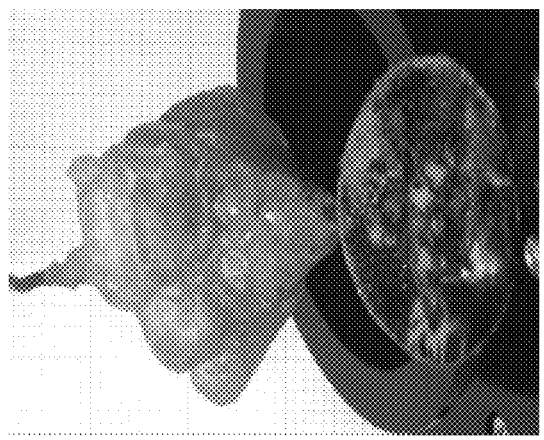
FIG. 3 is a photograph of $Gd_2O_3$:$Yb^{3+}$ crystals obtained from example 1, in accordance with one embodiment.
Figure 4:
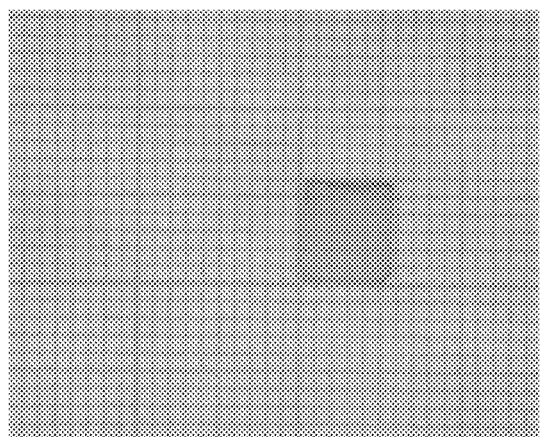
FIG. 4 is a photograph of a polished crystal obtained from example 1, in accordance with one embodiment.

A photograph of the $Gd_2O_3:Yb^{3+}$ crystals thus obtained is given in the appended FIG. 3. In this figure, the $Gd_2O_3:Yb^{3+}$ crystals were placed on a sheet of graph paper. It is observed that the crystals exhibit a size of the order of a centimetre in their large length. A photograph of a polished crystal of more than 25 mm$^2$ in surface area and 1.5 mm thickness not exhibiting any inclusion is presented in the appended FIG. 4. The working volume of such a crystal is consequently very high.

Figure 5:
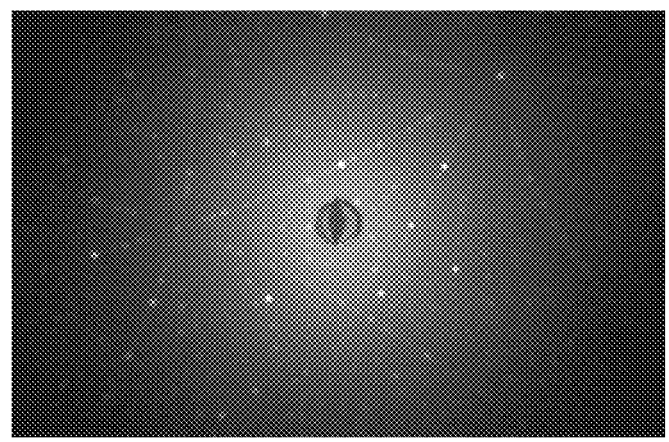
FIG. 5 is a Laue diffraction diagram from example 1, in accordance with one embodiment.

The Laue diffraction diagram is represented in the appended FIG. 5. In this figure, the measurements were made on an oriented (−2 −1 −1) natural face of a $Gd_2O_3$:Yb$^{3+}$ single-crystal on a goniometer sold under the reference GM WS series X-ray by Delta Technologies International, using a molybdenum anticathode and a CCD camera of the Photonics Science brand. This diagram is in accordance with the expected theoretical structure and confirms the cubic structure of the $Gd_2O_3:Yb^{3+}$ single-crystal obtained in this example.

COMPARATIVE EXAMPLE 1

Crystallogenesis of $Gd_2O$ Single-Crystals Doped with Ytterbium According to a Process NOT in Accordance with the Invention As comparative example to example 1 above, $Gd_2O_3$ single-crystals doped to 6.67% (molar) with ytterbium were prepared according to a process not in accordance with the invention, that is to say by using $[Li_6(Gd_{0.9333}Yb_{0.0667})(BO_3)_3]$ solvent (mixture not comprising $Li_2O$), to which 20 mol % of $Gd_2O_3:Yb^{3+}$ solute of formulation $(Gd_{0.9333}Yb_{0.667})_2O_3$ were added according to the process described in international application WO 2012/055075.

1) First stage: Preparation of a Solute Composed of a Mechanical Mixture of Gadolinium Sesquioxide and Ytterbium Sesquioxide The solute was prepared by mechanically mixing 93.33 mol % of $Gd_2O_3$ and 6.67 mol % of $Yb_2O_3$ according to the same process as that of stage 1) of example 1 above.

2) Second Stage: Preparation of the Mixture for the Synthesis

The mixture for the synthesis was prepared according to the following reaction 1:

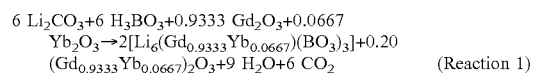

(Reaction 1)

The commercial $Li_2CO_3$, $H_3BO_3$, $Gd_2O_3$ and $Yb_2O_3$ powders were mixed according to the stochiometric proportions shown by reaction 1 above and then intimately ground in a mortar in order to obtain the finest particle size possible and the most homogeneous mechanical mixture possible. The mixture was subsequently heated in a platinum crucible under an air atmosphere according to the following heat treatment:

1) gradient of 120° C.·h$^{-1}$ up to 500° C. and then a stationary phase lasting 12 h;
2) gradient of 120° C.·h$^{-1}$ up to 800° C. and then a stationary phase lasting 12 h;
3) gradient of 180° C.·h$^{-1}$ up to 1250° C. and then a stationary phase lasting 2 h;
4) cooling down to ambient temperature with a cooling rate of 180° C.·h$^{-1}$.

The mixture of $[Li_6(Gd_{0.9333}Yb_{0.0667})(BO_3)_3]$ and $(Gd_{0.9333}Yb_{0.0667})_2O_3$ thus obtained was subsequently ground using a mortar and a pestle made of agate.

3) Third Stage: Crystallogenesis of the $Gd_2O_3:Yb^{3+}$ Single-Crystals 133.3055 g (80 mol %) of the solvent $[Li_6(Gd_{0.9333}Yb_{0.0667})(BO_3)_3]$ obtained above in stage 2) and 32.400 g (20 mol %) of the solute prepared above in stage 1) were mixed and intimately ground together in a mortar in order to obtain the finest particle size possible and the most homogeneous mechanical mixture possible. This mixture was subsequently placed in a platinum crucible.

The solution composed of $[Li_6(Gd_{0.9333}Yb_{0.0667})(BO_3)_3]$ (primary solvent) and of the solute of formulation $(Gd_{0.9333}Yb_{0.0667})_2O_3$ was subsequently melted under air, in the same vertical tubular furnace as that used above in example 1, by applying first of all a temperature rise gradient of 180° C.·h$^{-1}$ up to 1200° C.

$Gd_2O_3:Yb^{3+}$ was crystallized in the furnace described above in example 1, according to the protocol described in example 1, by using the same support as above in example 1, under an air atmosphere and according to the same heat treatment programme as that employed above in example 1.

Figure 6:
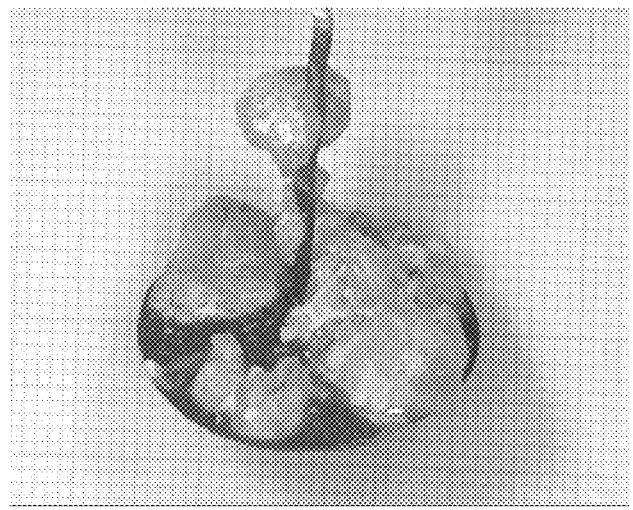
FIG. 6 is a photograph of $Gd_2O_3$:$Yb^{3+}$ crystals obtained from comparative example 1, in accordance with one embodiment.
Figure 7:
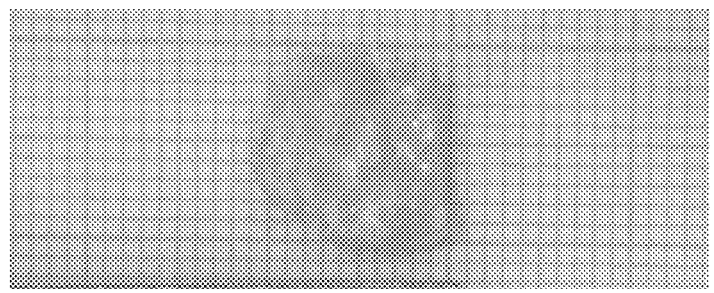
FIG. 7 is a photograph of a crystal obtained from comparative example 1, in accordance with one embodiment.

$Gd_2O_3:Yb^{3+}$ single-crystals were obtained on the platinum paddle with a horizontal disc, a photograph of which is given in the appended FIG. 6. In this figure, the $Gd_2O_3:Yb^{3+}$ crystals were placed on a sheet of graph paper. It is observed that the crystals obtained are more numerous and exhibit a lower mean size than that of the crystals obtained in example 1 above (in their large length). A photograph of a crystal in the centimetre range is represented in the appended FIG. 7. In this figure, it is observed that the crystal obtained according to the process not in accordance with the invention, that is to say by using a synthesis solvent not containing $Li_2O$, comprises numerous inclusions which have the consequence of limiting the working volume of the crystal, that is to say the volume where there is no inclusion.

Figure 8:
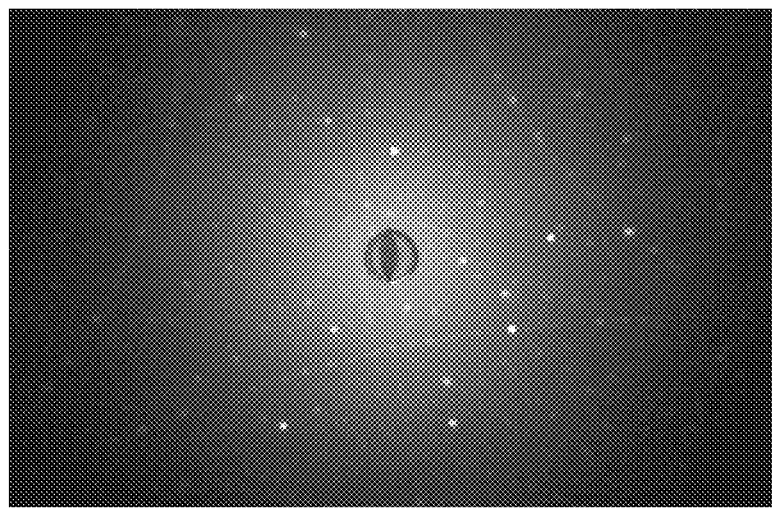
FIG. 8 is a Laue diffraction diagram from comparative example 1, in accordance with one embodiment.

The Laue diffraction diagram is represented in the appended FIG. 8. The measurements were made on an oriented (−2 −1 −1) natural face of a $Gd_2O_3$ single-crystal on a goniometer sold under the reference GM WS Series X-ray by Delta Technologies International, using a molybdenum anticathode and a CCD camera of the Photonics Science brand. This diagram is in accordance with the expected theoretical structure and confirms the cubic structure of the pure $Gd_2O_3$ single-crystal obtained.

EXAMPLE 2

Crystallogenesis of $Tb_2O_3$ Single-Crystals According to the Process in Accordance with the Invention In this example, pure single-crystal cubic terbium sesquioxides ($x_{mp}=0$ and $x=0$): $Tb_2O_3$, were prepared by using $[Li_6Tb(BO_3)_3]$ as primary solvent to which $z=17$ mol % of solute $Tb_2O_3$ were added.

An excess of $s=20$ mol % of $Li_2O$ was subsequently added to this base mixture.

1) First Stage: Preparation of the Solute $Tb_2O_3$

Before it was used, the commercial $Tb_2O_3$ powder was heated beforehand under argon/$H_2$ (5%) separately in order to obtain a dehydrated, perfectly stochiometric $Tb_2O_3$ powder exhibiting only terbium atoms having a valency of +III, according to the following reaction (2):

$Tb_4O_7 \rightarrow 2Tb_2O_3 + 0.5\ O_2$  (Reaction 2)

The heat treatment was as follows:
1) gradient of 180° C.·h$^{-1}$ up to 500° C. and then a stationary phase lasting 3 h;
2) gradient of 180° C.·h$^{-1}$ up to 850° C. and then a stationary phase lasting 3 h;
3) gradient of 180° C.·h$^{-1}$ up to 1250° C. and then a stationary phase lasting 48 h;
4) cooling down to ambient temperature with a cooling rate of 120° C.·h$^{-1}$.

This heat treatment was carried out in a platinum crucible.

The $Tb_2O_3$ powder was then subsequently used in the crystal synthesis in the hour which followed the end of the heat treatment mentioned above in order to prevent any reuptake of moisture.

2) Second Stage: Preparation of a Mixture PM1 Composed of $Tb_2O_3$ and of $[Li_6Tb(BO_3)_3]$ as Primary Solvent The mixture PM1 was prepared according to the following reaction 3:

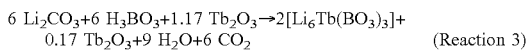

$6\ Li_2CO_3 + 6\ H_3BO_3 + 1.17\ Tb_2O_3 \rightarrow 2[Li_6Tb(BO_3)_3] + 0.17\ Tb_2O_3 + 9\ H_2O + 6\ CO_2$  (Reaction 3)

The commercial $Li_2CO_3$ and $H_3BO_3$ powders and the $Tb_2O_3$ powder as prepared above in stage 1) were mixed according to the stochiometric proportions shown by reaction 3 above and then intimately ground in a mortar in order to obtain the finest particle size possible and the most homogeneous mechanical mixture possible.

98.2793 g of primary solvent and 19.5344 g of solute $Tb_2O_3$ were prepared, 117.8137 g of mixture PM1 are thus obtained.

3) Third stage: Preparation of a Mixture PM2 by Addition of $Li_2O$ in Molar Excess to the Mixture PM1 Described Above in Stage 2)

A further 5.8018 g of $Li_2CO_3$ (i.e., the equivalent of 2.3463 g of $Li_2O$) were added to the 117.8137 g of mixture PM1 obtained above in the preceding stage. This corresponds to an addition of 20 mol % of excess of $Li_2O$ with respect to the mixture PM1.

The commercial $Li_2CO_3$ powder and the powder of the mixture PM1 were mixed and then intimately ground in a mortar in order to obtain the finest particle size possible and the most homogeneous mechanical mixture possible.

The resulting mixture was subsequently heated in a platinum crucible under an atmosphere of argon/$H_2$ (5 vol %) according to the following heat treatment:
1) gradient of 120° C.·h$^{-1}$ up to 500° C. and then a stationary phase lasting 12 h;
2) gradient of 120° C.·h$^{-1}$ up to 800° C. and then a stationary phase lasting 12 h;
3) gradient of 180° C.·h$^{-1}$ up to 1250° C. and then a stationary phase lasting 2 h;
4) cooling down to ambient temperature with a cooling rate of 180° C.·h$^{-1}$.

The mixture PM2 was subsequently ground using a mortar and a pestle made of agate. 120.16 g of mixture PM2 composed of 100.6256 g of synthesis solvent and 19.5344 g of $Tb_2O_3$, i.e. $z''=13.6$ mol % of solute in the synthesis solvent, were thus obtained.

4) Fourth Stage: Crystallogenesis of the $Tb_2O_3$ Single-Crystals

The mixture PM2 obtained above in the preceding stage was subsequently placed in a platinum crucible.

The mixture PM2 was subsequently melted under argon, in a vertical tubular furnace identical to that used above in example 1, by applying first of all a temperature rise gradient of 180° C.·h$^{-1}$ up to 1235° C.

A paddle in the form of a shovel was immersed by translation in the reaction mixture at the centre of the crucible. Stirring by rotation around the axis of the rod, of the order of 30 revolutions/mm, was carried out for 24 hours at 1235° C. with the aim of thoroughly homogenizing the dissolved entities (solute) in the synthesis solvent and of preventing them from sedimenting, if appropriate.

In view of the high viscosity of the molten bath, sufficient stirring, of the order of 20 rev/min, proved to be necessary in order to keep the entities dissolved throughout the liquid phase and to alleviate the effects of sedimentation of the solute. Crystal growth was carried out according to the following heat treatment programme:

Starting temperature: 20° C.,
gradient of 180° C.·h$^{-1}$ up to 1235° C. and then a stationary phase lasting 24 h,
cooling at a rate of 0.2° C.·h$^{-1}$ down to 1175° C.,
rise at a rate of 120° C.·h$^{-1}$ up to 1210° C.,
cooling at a rate of 0.2° C.·h$^{-1}$ down to 1160° C.
no pulling from the solution over the temperature range from 1235° C. to 1160° C.,
extraction of the paddle above the molten bath at 1160° C.,
gradient of 7° C.·h$^{-1}$ down to 800° C.,
gradient of 30° C.·h$^{-1}$ down to ambient temperature.

Figure 9:
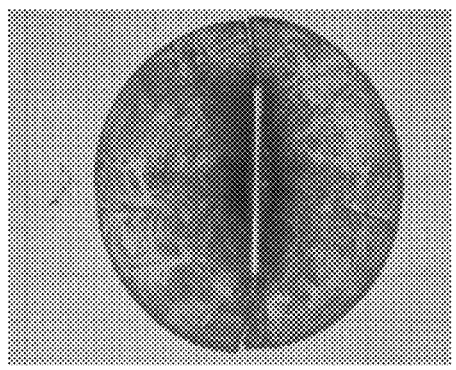
FIG. 9 shows a broad disc composed of several $Tb_2O_3$ single-crystals obtained from example 2 in accordance with one embodiment.
Figure 10:
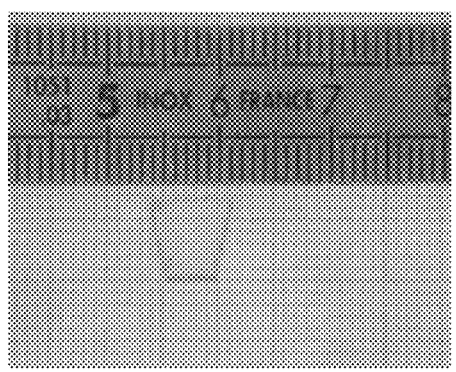
FIG. 10 is a photograph of a portion extracted from the disc, from example 2 in accordance with one embodiment.

A broad disc composed of several $Tb_2O_3$ single-crystals was thus obtained at the end of approximately 20 days. The photograph of this disc is given in the appended FIG. 9. In this figure the $Tb_2O_3$ disc has been placed on graph paper (1 square=1 mm). It is observed that the crystals exhibit a size of the order of a centimetre. The appended FIG. 10 presents a photograph of a portion extracted from the disc, this portion exhibiting dimensions of more than 5×5×1.2 mm$^3$ without any inclusion.

Figure 11:
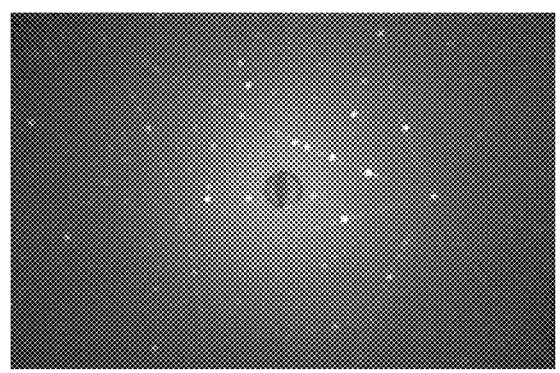
FIG. 11 is a Laue diffraction diagram from example 2, in accordance with one embodiment.

Furthermore, the Laue diffraction diagram obtained by the Laue method is represented in the appended FIG. 11. The growth axis of the disc was determined as being (6 2 1). The measurements were made on a goniometer sold under the reference GM WS series X-ray by Delta Technologies International, using a molybdenum anticathode and a CCD camera of the Photonics Science brand. This diagram is in accordance with the expected theoretical structure and confirms the cubic structure of one of the $Tb_2O_3$ single-crystals obtained.

This crystal was also tested in order to measure its Verdet constant. It should be remembered that a nonabsorbing isotropic diamagnetic or paramagnetic medium, or more generally one not exhibiting a difference in absorption between two right and left circular polarization forms of light, brings about a simple rotation θ of the polarization of the electric field of a rectilinearly polarized electromagnetic wave when this medium is subjected to a magnetic induction field B applied along the direction of propagation of this wave. This phenomenon, known as the Faraday effect, results from the magnetic circular birefringence induced in the medium, (solely) the single pass effect of which is similar to that of natural circular birefringence, also known as optical activity. The classical theory of the electron (Lorentz model) in combination with the Maxwell equations makes it possible to show that the Faraday rotation is both proportional to the amplitude of the magnetic induction field B and to the length l of the material traversed, so that $θ=V(λ)·l·B$, where $V(λ)$ is a constant dependent on the material and a function of the wavelength λ: this is the Verdet constant.

The crystal was positioned at the centre of the air gap of an electromagnet delivering a continuous magnetic field which can range from 0 mT to 1200 mT. An analyser and a polarizer were positioned in crosswise fashion on either side of the assembly, in order to have extinction of the light at the downstream detector. An upstream laser source, the wave vector of which is collinear with the magnetic field, was then passed. At each value B of the magnetic field, the analyser was rotated by an angle θ (rad) in order to again obtain the extinction of the light at the detector.

Figure 12:
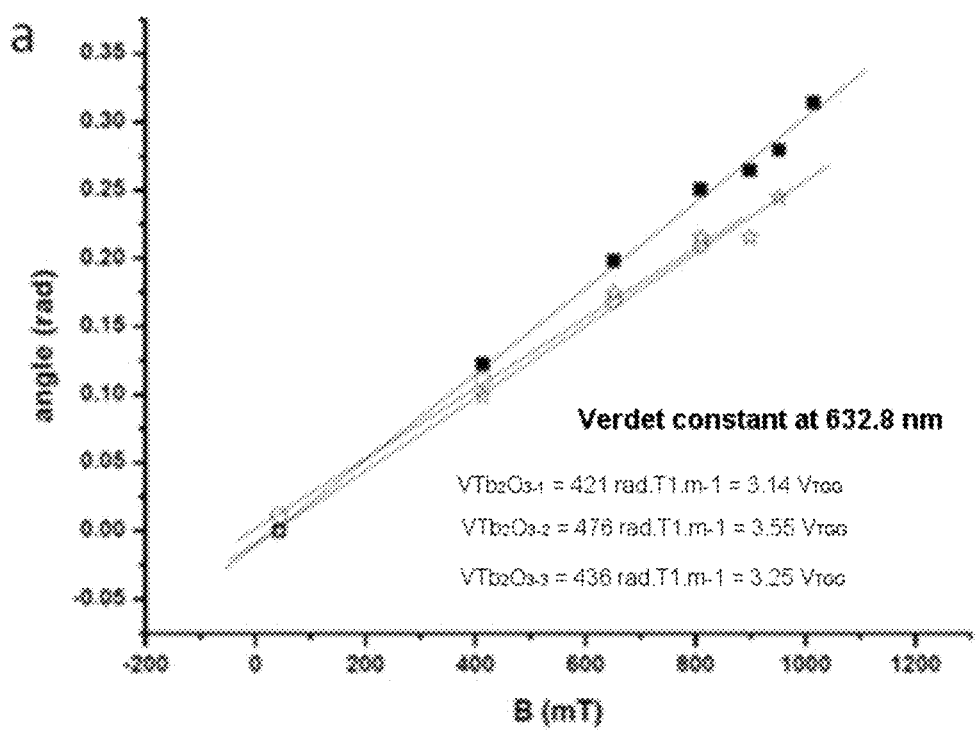
FIGS. 12a and 12b are graphs showing the measurements carried out for 2 different laser sources (He—Ne at 632.8 rim (FIG. 12a) and Nd:YAG at 1064 nm (FIG. 12b)) from example 2, in accordance with one embodiment.
Figure 12:
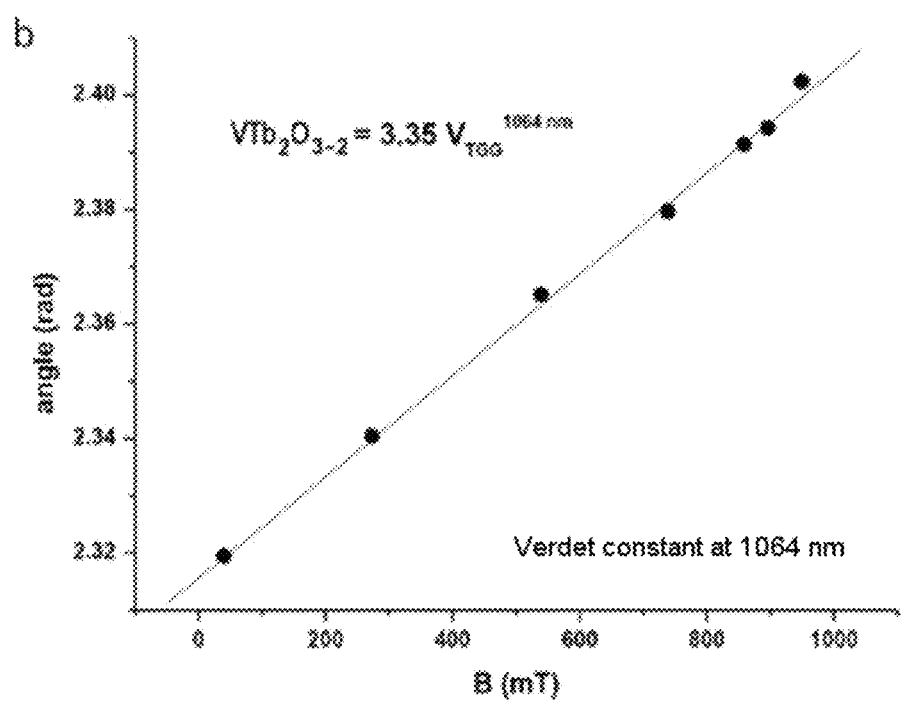

The results obtained are represented in the appended FIG. 12. The two graphs show the measurements carried out for 2 different laser sources (He—Ne at 632.8 nm (FIG. 12*a*) and Nd:YAG at 1064 nm (FIG. 12*b*)). In these figures, the angle (in rad) is a function of the magnetic field B (in mT). The linear regression of the straight lines obtained gives the Verdet constant $V(λ)$.

Three samples $Tb_2O_{3\text{-}1}$, $Tb_2O_{3\text{-}2}$ and $Tb_2O_{3\text{-}3}$ prepared according to the process described the present in example were thus tested at 632.8 nm and one sample ($Tb_2O_{3\text{-}2}$) was tested at 1064 nm.

The $V(λ)$ values for $Tb_2O_3$ were compared with those of TGG, which is currently the most efficient material in terms of values of Verdet constant ($V_{TGG}(632.8\text{ nm})=134$ rad·T$^{-1}$·m$^{-1}$; $V_{TGG}(1064\text{ nm})=40$ rad·T$^{-1}$·m$^{-1}$).

The results obtained show that the values of Verdet constant for $Tb_2O_3$ according to these 2 wavelengths are at least three times greater than that of TGG.

COMPARATIVE EXAMPLE 2

Crystallogenesis of Pure $Tb_2O_3$ Single-Crystals According to a Process NOT in Accordance with the Invention In this example, pure single-crystal cubic terbium sesquioxides $Tb_2O_3$ were prepared according to a process not in accordance with the invention, that is to say by using $[Li_6Tb(BO_3)_3]$ as solvent for the synthesis (solvent not comprising $Li_2O$) with 17 mol % of solute $Tb_2O_3$.

1) First Stage: Preparation of the Solute $Tb_2O_3$

The solute $Tb_2O_3$ was prepared as indicated above in stage 1) of example 2.

The $Tb_2O_3$ powder was then subsequently used in the crystal synthesis in the hour which followed the end of the heat treatment mentioned above in order to prevent any reuptake of moisture.

2) Second Stage: Preparation of the Solvent $[Li_6Tb(BO_3)_3]$ for the Synthesis The solvent $[Li_6Tb(BO_3)_3]$ for the synthesis was prepared according to reaction 3 described above in stage 2) of example 2, following the same protocol.

83.8504 g of solvent $[Li_6Tb(BO_3)_3]$ for the synthesis were thus obtained, which solvent was subsequently ground using a mortar and a pestle made of agate.

3) Third Stage: Crystallogenesis of the $Tb_2O_3$ Single-Crystals 83.8504 g (83 mol %) of $[Li_6Tb(BO_3)]$ obtained above in stage 2) and 16.6662 g (17 mol %) of $Tb_2O_3$ prepared above in stage 1) were mixed and intimately ground together in a mortar in order to obtain the finest particle size possible and the most homogeneous mechanical mixture possible. This mixture was subsequently placed in a platinum crucible.

Crystal growth was subsequently carried out under the same conditions as those described in detail above in stage 4) of example 2.

Figure 13:
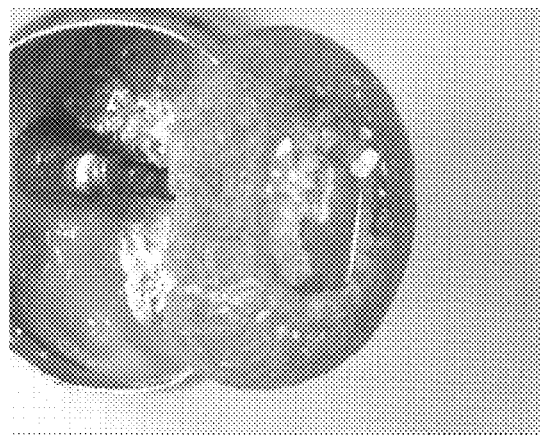
FIG. 13 is a photograph of an agglomerate of $Tb_2O_3$ single-crystals from comparative example 2, in accordance with one embodiment.
Figure 14:
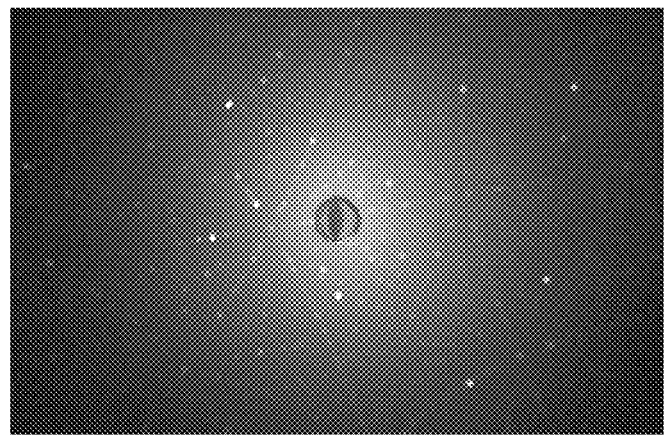
FIG. 14 is a Laue diffraction diagram from example 2, in accordance with one embodiment.

An agglomerate of $Tb_2O_3$ single-crystals was thus obtained; the photograph of this is given in the appended FIG. 13. In this Figure, the $Tb_2O_3$ crystals were placed on graph paper (1 square=1 mm). It was observed that the crystals exhibit a size of the order of a few millimetres. Furthermore, the Laue diffraction diagram obtained by the Laue method is represented in the appended FIG. 14. The measurements were made on an oriented (−1 −1 0) natural face of a $Tb_2O_3$ single-crystal on a goniometer sold under the reference GM WS series X-ray by Delta Technologies International, using a molybdenum anticathode and a CCD camera of the Photonics Science brand. This diagram is in accordance with the expected theoretical structure and confirms the cubic structure of one of the $Tb_2O_3$ single-crystals obtained.

The invention claimed is:

1. A process for the preparation of a bulk or thin-film single-crystal formed of a matrix of a cubic sesquioxide of scandium, yttrium and/or rare earth metal, said matrix being doped or not doped with at least one element of the series of the lanthanides, said single-crystal corresponding to the following formula (I):

$$(R^1_{1-x}R^2_x)_2O_3 \quad\quad (I)$$

in which:
R¹ is at least one metal with a valency of III selected from the group consisting of scandium, yttrium and the elements of the series of the lanthanides;
x is such that 0≤x<1;
R² represents at least one element selected from the group consisting of from the series of the lanthanides;
said process being carried out in a chemically inert crucible and comprising the following stages:
1) preparing a pulverulent mixture (PM1) comprising at least:
a solute composed of at least one sesquioxide of following formula (IIa):

$$R'_2O_3 \quad (IIa),$$

in which R'¹ represents the same element as R¹, and, when said matrix is doped with at least one element of the series of the lanthanides, of at least one sesquioxide of following formula (IIb):

$$R'^2_2O_3 \quad (IIb),$$

in which R'² represents the same element as R², in a molar percentage ($x_{mp}$) such that $0<x_{mp}\leq25$ mol %, said sesquioxide of formula (IIa) is present within said solute in a molar percentage $100-x_{mp}$, said solute being present within the mixture PM1 in an amount z such that 0<z≤93 mol %,
a primary solvent composed of a mechanical mixture of a compound of following formula (III):

$$[Li_6(R''^1_{1-x'}R''^2_{x'})(BO_3)_3] \quad (III)$$

in which R''¹ and R''² respectively represent the same element as R¹ and R² and x' is such that 0≤x'<1;
2) preparing a pulverulent mixture PM2 comprising said solute and a synthesis solvent of following formula (IV):

$$[Li_6(R''^1_{1-x'}R''^2_{x'}(BO_3)_3] + (Li_2O \text{ and/or } B_2O_3 \text{ and/or } LiX) \quad (IV)$$

in which R''¹ and R''² respectively represent the same element as R¹ and R², x' is such that 0≤x'<1, and X=F, Cl, Br or I, by addition to the mixture PM1 of at least one pulverulent additive selected from the group consisting of $Li_2O$, $B_2O_3$ and LiX with X=F, Cl, Br or I, said mixture PM1 being present within the mixture PM2 in an amount z' such that 15≤z'<100 mol %, said additive being present within the mixture MP2 in a total molar amount s such that 0<s≤85 mol %, and s=100-z' in the mixture PM2; the molar amount z" of the solute within the mixture PM2 being such that z"=z·z';
3) bringing the pulverulent mixture PM2 obtained above in stage 2) to a temperature $T_{PM2}$ at least equal to the melting point ($T_{Mp}$) of said mixture PM2 and ≤1250° C., in order to bring about the dissolution of the solute in the synthesis solvent of formula (IV) and to obtain a liquid solution of said solute in the synthesis solvent of formula (IV);
4) maintaining the temperature of the liquid solution at the temperature $T_{PM2}$ for a period of time of at least 6 hours, with stirring by means of a solid support subjected to rotation around a vertical axis;
5) cooling, in controlled fashion, the liquid solution from the temperature $T_{PM2}$ down to a temperature $T_{Exp}$ between the saturation temperature ($T_{Sat}$) of the liquid solution and the critical supersaturation temperature ($CT_{Super}$) of the liquid solution or the temperature of solidification of the liquid solution, in order to bring about the controlled crystallization of the expected sesquioxide of formula (I) on said solid support immersed in said liquid solution and subjected to rotation around a vertical axis, said cooling being carried out at a maximum rate of 1° C.·h⁻¹; and
6) withdrawing the solid support from the liquid solution and then cooling, in controlled fashion, the sesquioxide of formula (I) crystallized on the solid support from the temperature $T_{Exp}$ down to ambient temperature, at a maximum rate of 50° C.·h⁻¹.

2. The process according to claim 1, wherein the stages 1) and 2) are carried out jointly, the molar amount (z") of the solute within the mixture PM2 then being such that z"=z·z' mol %, the molar amount of the primary solvent of formula (III) (t) being such that t=z'(100−z) mol % and the molar amount of additive being s mol %, with s=(100−z') %.

3. The process according to claim 1, wherein R¹ is selected from the group consisting of the elements Y, Gd, Tb, Eu, Sc, Lu; the combinations of elements Y/Gd, Y/Sc, Gd/Sc, Lu/Sc, Gd/La, Gd/Tb, Gd/Lu, Y/Lu, Eu/Gd, Eu/La and Eu/Lu.

4. The process according to claim 1, wherein, when x>0, R² is selected from the group consisting of the elements Yb, Tm, Er, Pr, Tb, Nd, Ce, Ho, Eu, Sm, Dy, the combinations of elements Yb/Tm, Yb/Pr, Tm/Ho, Er/Yb, Yb/Tb, Yb/Ho, Eu/Sm and Tm/Tb.

5. The process according to claim 1, wherein said process is employed for the preparation of sesquioxides of formula (I) selected from the group consisting of:
$Tb_2O_3$; $Gd_2O_3$; $Eu_2O_3$; $Y_2O_3$; $Lu_2O_3$; $Sc_2O_3$; $(Tb,Gd)_2O_3$; $(Eu,Gd)_2O_3$; $Lu_2O_3$:Yb; $Gd_2O_3$:Yb; $Lu_2O_3$:Eu; $Gd_2O_3$:Eu; $Y_2O_3$:Eu; $Y_2O_3$:Er; $Gd_2O_3$:Tm; $Gd_2O_3$:Eu³⁺; $(Y,Gd)_2O_3$:Pr; $(Y,Gd)_2O_3$:Eu; $(Y,Gd)_2O_3$:Nd; $(Y,La)_2O_3$:Pr; $(Gd,La)_2O_3$:Pr; $(Gd,La)_2O_3$:Yb; $(Gd,La)_2O_3$:Eu; $(Gd,La)_2O_3$:Nd; $(Y,La)_2O_3$:Yb; $Y_2O_3$:Er:Yb; $Y_2O_3$:Pr:Yb; $Gd_2O_3$:Er:Yb; $Gd_2O_3$:Pr:Yb; $Gd_2O_3$:Tm:Yb; $Lu_2O_3$:Tm:Yb; $Y_2O_3$:Tm:Ho; $Y_2O_3$m:Yb; $Y_2O_3$:Tm: Tb; $Sc_2O_3$:Eu; $(Y,Lu)_2O_3$:Eu and $(Gd,Lu)_2O_3$:Eu.

6. The process according to claim 1, wherein the amount z" of solute present within the pulverulent mixture PM2 is such that 5≤z"≥30 mol %.

7. The process according to claim 1, wherein the amount s of $Li_2O$ and/or of $B_2O_3$ and/or of LiX present within the pulverulent mixture PM2 is such that 5≤s≤30 mol %.

8. The process according to claim 1, wherein $x_{mp}=0$ or $0<x_{mp}\leq10$ mol %.

9. The process according to claim 1, wherein the pulverulent mixture PM2 produced during stages 1) and 2) and comprising the solute composed of a sesquioxide of formula (IIa) as a mixture or not with a sesquioxide of formula (IIb) and the synthesis solvent of formula (IV) is prepared according to the process comprising the substages:
i) preparing, by mechanical grinding, a pulverulent mixture comprising 6 mol of $Li_2CO_3$, 6 mol of $H_3BO_3$, 1+z mol of a sesquioxide of formula (IIa) or of a mixture of a sesquioxide of formula (IIa) and of a sesquioxide of formula (IIb), to which an excess of 20 mol % of at least one additive selected from the group consisting of $Li_2O$ (in the $Li_2CO_3$ form), $B_2O_3$ (in the $H_3BO_3$ form) and LiX, with X=F, Cl, Br or I, is added;
ii) subjecting the mixture obtained above in stage i) to a heat treatment comprising:
a rise in temperature up to a temperature T1 of from 400 to 500° C., according to a temperature rise gradient of from 120 to 180° C.·h⁻¹,
a stationary phase during which the temperature T1 is maintained for from 6 to 24 hours, a rise in temperature up to a temperature T2 of from 700 to 800° C., according to a temperature rise gradient of from 120 to 180° C.·h$^{-1}$, a stationary phase during which the temperature T2 is maintained for from 6 to 24 hours, a return to ambient temperature with a cooling gradient of from 120 to 180° C.·h$^{-1}$, in order to obtain a solid material in the form of particles, said material being composed of the synthesis solvent of formula (IV) as a mixture with z″ mol % of solute; and iii) mechanically grinding the solid material obtained above in stage ii) in order to obtain the pulverulent mixture PM2.

10. The process according to claim 1, wherein, during stage 3), the temperature TPM2 is from 1200° C. to 1250° C. and the rate at which the mixture PM2 is brought to the temperature $T_{PM2}$ is 120° C.·h$^{-1}$.

11. The process according to claim 1, wherein, during stage 5), the temperature $CT_{Super}$ is 1100° C. and the controlled cooling of the liquid solution from the temperature $T_{PM2}$ down to a temperature $T_{Exp}$ is carried out at a rate of from 0.1 to 1° C.·h$^{-1}$.

12. The process according to claim 1, wherein, during stages 4) and 5), the rotational speed of the solid support varies from 5 to 50 revolutions/min.

13. The process according to claim 1, wherein the cooling of stage 5) is carried out at a rate of 0.2° C.·h$^{-1}$ from the temperature $T_{PM2}$ down to a temperature $CT_{Super}$ of 1100° C., after extracting the support from the liquid and positioning the support above the liquid solution, and then the temperature of 1100° C. is maintained for a time of less than 1 hour before carrying out the cooling mentioned in stage 6).

14. The process according to claim 1, wherein the cooling of stage 5) is a heat treatment comprising an alternation of cooling stages and of temperature-rise stages in which the amplitude of each temperature-rise stage is less than or equal to the amplitude of the cooling stage which precedes it.

15. The process according to claim 14, wherein the rate of cooling varies from 0.1 to 0.2 C.·h$^{-1}$ and the cooling of stage 5) is carried out according to the following heat treatment:

Starting temperature: 1200° C.
i) gradient of 0.2° C.·h$^{-1}$ down to 1175° C.,
ii) gradient of 180° C.·h$^{-1}$ up to 1190° C.,
iii) gradient of 0.2° C.·h$^{-1}$ down to 1150° C.,
iv) gradient of 180° C.·h$^{-1}$ up to 1165° C.,
v) gradient of 0.2° C.·h$^{-1}$ down to 1125° C.,
vi) gradient of 180° C.·h$^{-1}$ up to 1140° C.,
vii) gradient of 0.2° C.·h$^{-1}$ down to 1100° C.,
viii) gradient of 180° C.·h$^{-1}$ up to 1115° C.,
ix) gradient of 0.2° C.·h$^{-1}$ down to 1100° C.

16. The process according to claim 14, wherein the cooling of stage 6) is carried out at a rate of 5° C.·h$^{-1}$ down to 800° C. and then of 30° C.·h$^{-1}$ down to ambient temperature.

* * * * *

UNITED STATES PATENT AND TRADEMARK OFFICE
CERTIFICATE OF CORRECTION

PATENT NO. : 9,945,049 B2
APPLICATION NO. : 14/903761
DATED : April 17, 2018
INVENTOR(S) : Philippe Veber et al.

Page 1 of 1

It is certified that error appears in the above-identified patent and that said Letters Patent is hereby corrected as shown below:

In the Claims

Column 20, Claim 6, Line 41:
The equation is currently listed as "$5 \leq z" \geq 30$ mol %".
However, it should read "$5 \leq z" \leq 30$ mol %".

Signed and Sealed this
Twelfth Day of June, 2018

Andrei Iancu
*Director of the United States Patent and Trademark Office*